(12) United States Patent
Dobritz et al.

(10) Patent No.: US 7,867,817 B2
(45) Date of Patent: Jan. 11, 2011

(54) METHOD FOR MANUFACTURING A WAFER LEVEL PACKAGE

(75) Inventors: Stephan Dobritz, Dresden (DE); Harry Hedler, Germering (DE); Henning Mieth, Jahnsdorf (DE)

(73) Assignee: Qimonda AG, Munich (DE)

( * ) Notice: Subject to any disclaimer, the term of this patent is extended or adjusted under 35 U.S.C. 154(b) by 237 days.

(21) Appl. No.: 12/023,853

(22) Filed: Jan. 31, 2008

(65) Prior Publication Data

US 2009/0194881 A1 Aug. 6, 2009

(51) Int. Cl.
*H01L 21/00* (2006.01)
(52) U.S. Cl. .............. 438/106; 438/117; 438/612; 257/692; 257/737; 257/E23.021; 257/E23.015
(58) Field of Classification Search .......... 257/276, 257/E23.013; 438/117
See application file for complete search history.

(56) References Cited

U.S. PATENT DOCUMENTS

| | | | | |
|---|---|---|---|---|
| 6,245,595 B1 * | 6/2001 | Nguyen et al. | ............. | 438/108 |
| 6,462,414 B1 * | 10/2002 | Anderson | ................. | 257/738 |
| 6,521,970 B1 * | 2/2003 | Takiar et al. | ................ | 257/522 |
| 7,132,312 B2 * | 11/2006 | Huang et al. | ................ | 438/113 |
| 2002/0130412 A1 * | 9/2002 | Nagai et al. | ................. | 257/737 |
| 2005/0070049 A1 * | 3/2005 | Cheng et al. | ................ | 438/117 |
| 2005/0202593 A1 * | 9/2005 | Chen et al. | .................. | 438/108 |
| 2006/0003569 A1 | 1/2006 | Farnworth et al. | | |
| 2006/0186540 A1 * | 8/2006 | Buchwalter et al. | ........ | 257/737 |
| 2007/0020916 A1 | 1/2007 | Farnworth | | |

FOREIGN PATENT DOCUMENTS

| | | | |
|---|---|---|---|
| KR | 10 2001 0045280 A | 6/2001 | |
| KR | 10 2001 0105641 A | 11/2001 | |
| KR | 10 2006 0024451 A | 3/2006 | |

* cited by examiner

*Primary Examiner*—Julio J Maldonado
*Assistant Examiner*—Shaka Scarlett
(74) *Attorney, Agent, or Firm*—John S. Economou

(57) ABSTRACT

A method for manufacturing a wafer level package of an integrated circuit element for direct attachment to a wiring board is disclosed. An integrated circuit element includes input/output pads located on an active side. A non-conductive support structure is formed on the active side of the integrated circuit element in an area that is free from input/output pads. A conductive path is formed upon the support structure and a non-conductive coating is formed on over the active side of the integrated circuit element such that a surface is formed which leaves interface pads accessible.

21 Claims, 5 Drawing Sheets

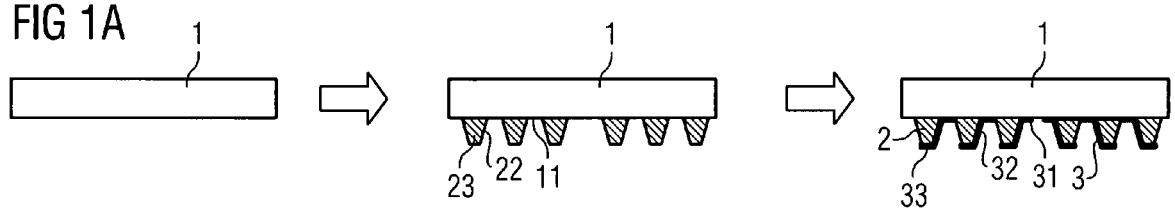
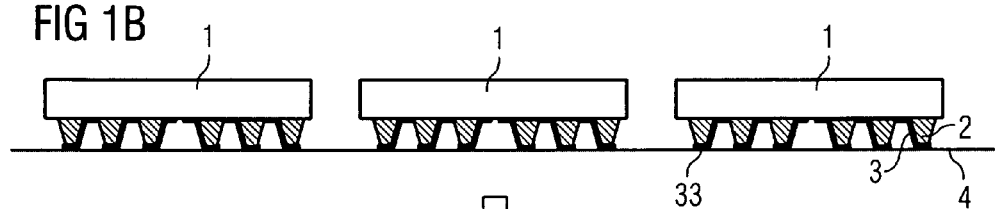
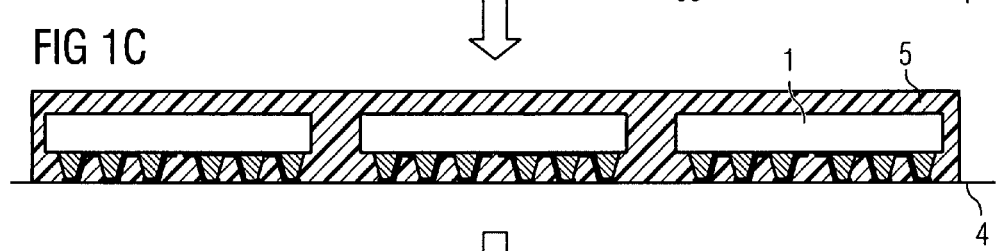
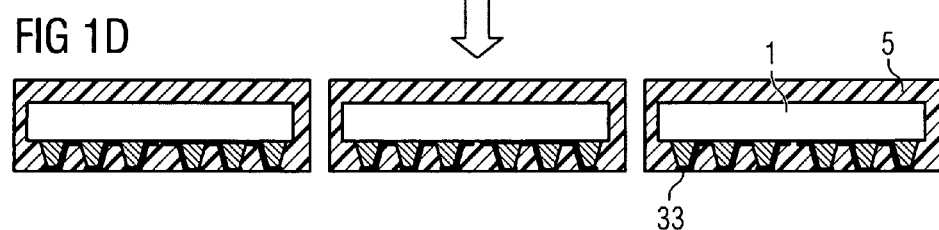

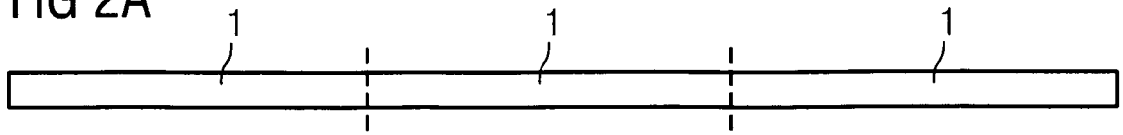
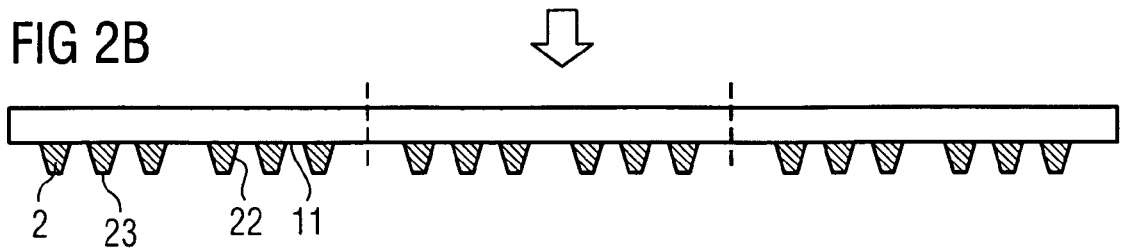
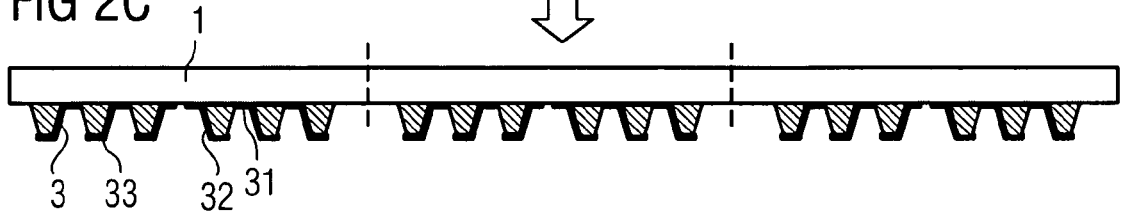
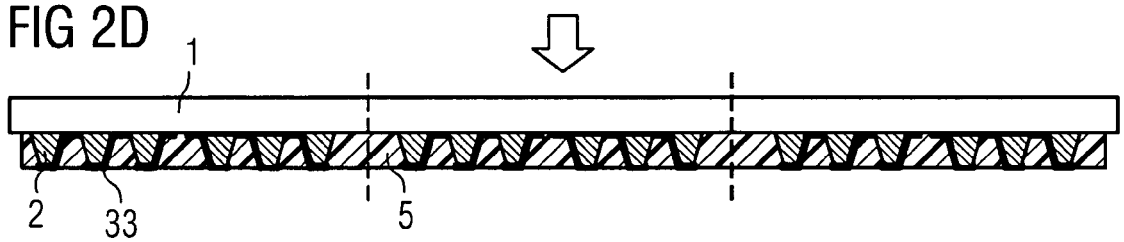
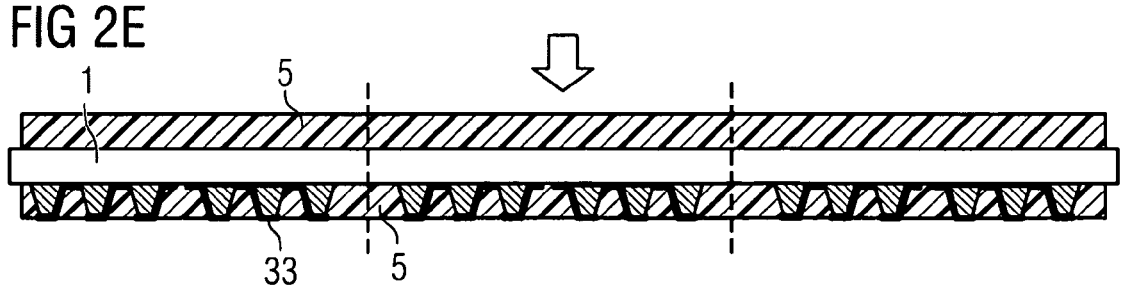
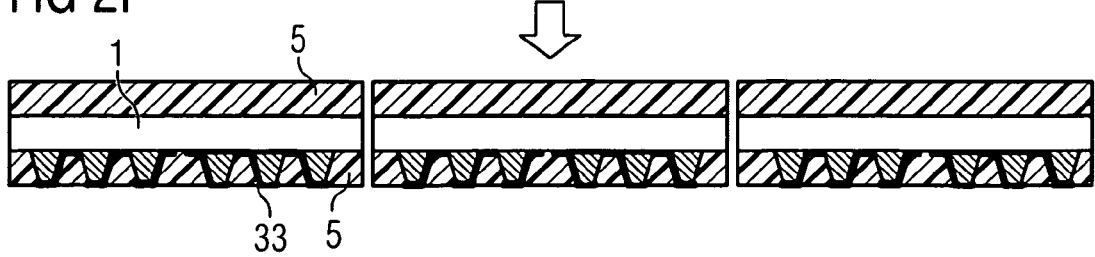

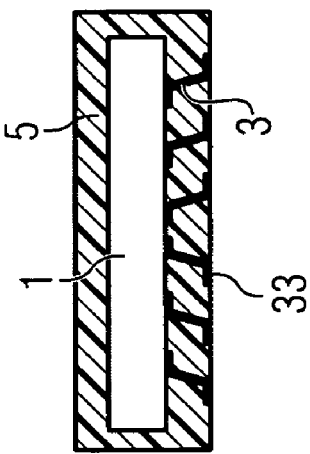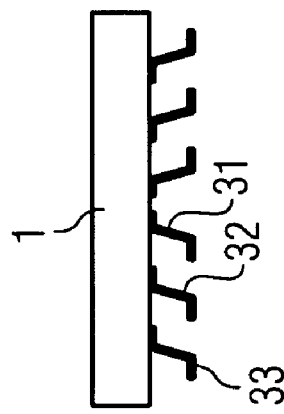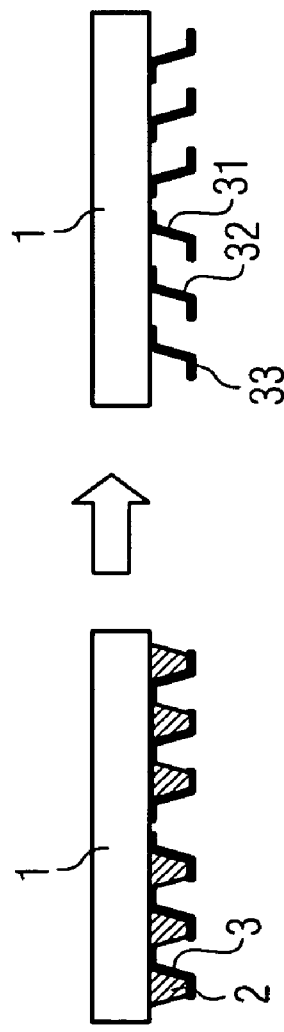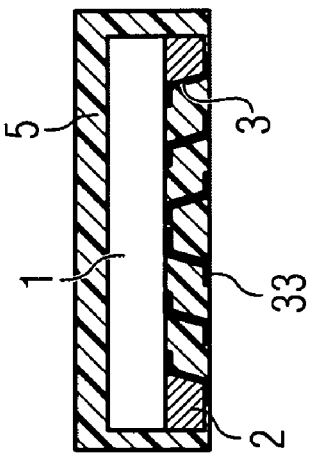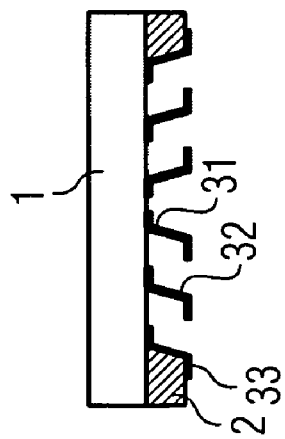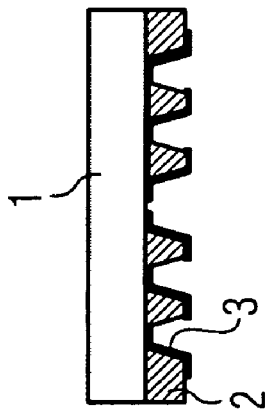

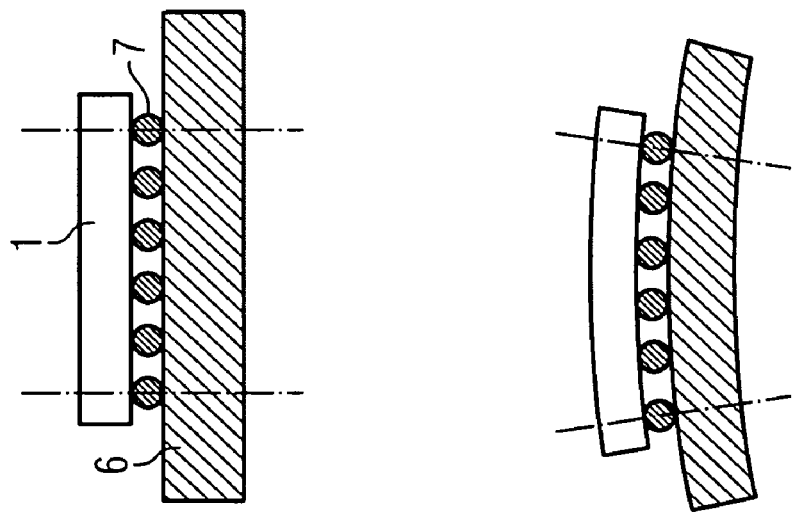
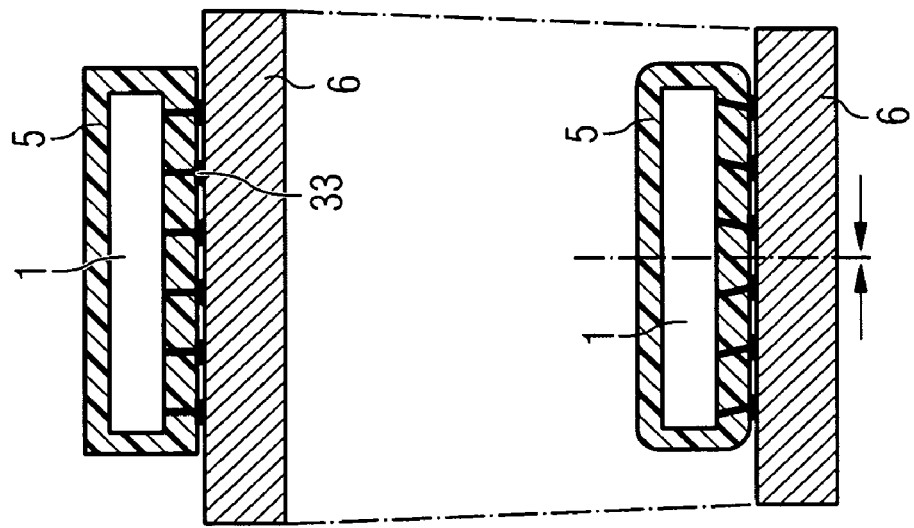
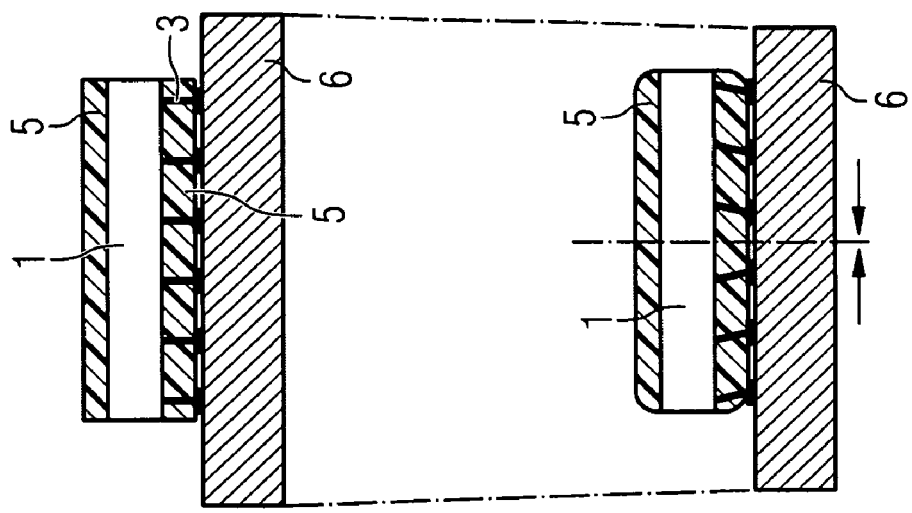

METHOD FOR MANUFACTURING A WAFER LEVEL PACKAGE

TECHNICAL FIELD

Embodiments of the present invention disclose a method for manufacturing a wafer level package, which comprises an integrated circuit element that may be attached directly to a wiring board.

BACKGROUND

A chip scale package (CSP) is a type of integrated circuit chip carrier that has no pins or wires but uses contact pads instead. To be considered a CSP, a package must have an area no greater than 1.2 times that of the die package. The die may be mounted on an interposer upon which pads or balls are formed, as in ball grid array (BGA) packaging and flip chip BGA packaging, or the pads may be etched or printed directly onto the silicon wafer, resulting in a package very close to the size of the silicon die: such a package is called a wafer level chip scale package (WL-CSP) or a wafer level package (WLP).

BRIEF DESCRIPTION OF THE DRAWINGS

In the accompanying figures, embodiments of packages made according to the proposed method and schematic drawings of typical steps of the method are provided wherein:

FIGS. 1A-1D, collectively as FIG. 1, shows a first embodiment of the method;

FIGS. 2A-2F, collectively as FIG. 2, shows a second embodiment of the method;

FIGS. 4A-4C, collectively as FIG. 4, shows a method for making a package without support structures;

FIGS. 5A-5C, collectively as FIG. 5, shows a method for making a package with a reduced number of support structures; and FIG. 6A (Prior Art) and FIGS. 6B-6C, collectively as FIG. 6, compares the behavior of conventional packages to that of packages made according to the proposed method.

DETAILED DESCRIPTION OF ILLUSTRATIVE EMBODIMENTS

Figure 3A:
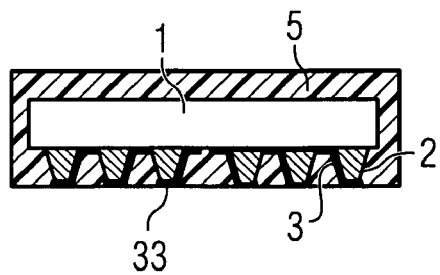
FIGS. 3A-3F, collectively as FIG. 3, shows attachment variants for the package.

Embodiments of the present invention provide for true wafer level chip scale packaging. For example, a first embodiment method may be employed to manufacture direct attach packages that better withstand thermal loads than those known in the art. The packages thus obtained are better able to endure thermal loads without suffering breakage of the electrical connections between the integrated circuit chip and the printed wiring board to which they are attached. Such breakage usually occurs due to a CTE mismatch between the materials of the chip and the board, respectively. Typical CTE values of silicon chips are in the magnitude of 3 ppm/K, while printed wiring boards may have a CTE of around 16 ppm/K. Thus, when a silicon chip is attached to a printed wiring board via solder balls, variation of the operational temperature of a package leads to different expansion of the chip versus the printed wiring board, resulting in warpage of the package and potentially in breakage of the interconnections between the chip and board.

A package made according to the proposed method may, by contrast, survive such temperature fluctuations due to the construction of its interconnecting elements. The package comprises interconnecting elements (referred to as conductive paths hereinafter) of great flexibility. The flexibility of these interconnecting elements may, for instance, be enabled and supported by embedding them in a relatively flexible material. In other words, instead of relying on relatively rigid solder balls, the chips are connected to the board via elastic, resilient, almost spring-like thin connectors which in turn may, in an embodiment, be surrounded by a relatively flexible material which is able to compensate for shear stress induced between the chip and the board due to different magnitudes of strain at the same temperature level.

Furthermore, a package made according to embodiments disclosed herein need not be undermolded since at least its active side is already covered with a dielectric encapsulant. In an embodiment, the inactive side (i.e., the side opposite the active side) is also covered with a dielectric encapsulant, for instance a polymer resin, thus providing an even better compensation for thermal loads. For better symmetry, the dielectric cover layers on both sides of the chip may be made of the same material, allowing the forming of both layers at once. Furthermore, both dielectric cover layers may be designed to have a similar thickness, thus providing for an even better compensation of thermal loads.

The thin, flexible conductive paths may comprise a first, second and third portion. The first portion, referred to as an interconnect pad hereinafter, is electrically connected to a corresponding input/output pad located on the active side of an integrated circuit element. The second portion, referred to as a riser element hereinafter, protrudes away from the interconnect pad and the active side of the chip and terminates with the third portion. The third portion, referred to as an interface pad hereinafter, serves to connect the conductive path to a contact pad of the printed wiring board. To this end, the interface pads remain accessible at all times, i.e., they are not covered with encapsulant material of the non-conductive coating.

The conductive paths may be manufactured in several ways, including, but not limited to sputtering, plating and so forth. For instance, a metal layer may be formed in a sputtering process. The metal may, for instance, be Cu, Ni, Au or another suitable metal or alloy. After formation of the metal layer, the metal is removed selectively, i.e., only the conductive paths, comprising an interconnect pad on top of the input/output pad of the chip, an interface pad at a distance from the chip's surface and a thin conductive line connecting the interconnect pad and the interface pad, i.e., the riser element, remain on the chip. Selective removal of the conductive material may be done in a conventional photolithographic process.

In order to form conductive paths of the kind described above, it is proposed that prior to forming the conductive layer, a non-conductive support structure is formed on the active side of the integrated circuit element in an area which is free from input/output pads. The support structure comprises at least one apex area and at least one slope area. The apex area is spaced apart from the active side of the chip. The slope area extends from the active side of the chip to the apex area of the support structure. In a simple embodiment, the support structure is a stud, which may, for example, be cylindrical or frustum-shaped. In this case, one dedicated stud may be provided for each input/output pad on the active side of the chip, giving support for a single conductive path. In another embodiment, a complex, three-dimensional structure is provided to give support to several, or all, conductive paths. In this case, the support structure must have a slope area and an apex area for each conductive path to be supported.

The support structure or structures, as the case may be, are made of a non-conductive material, as for instance a polymer resin like SU8 or the like, and may be manufactured in a number of ways, including, but not limited to printing, spinning, followed by lithography, and so forth, and may have a maximum thickness (or height, measured between the active side of the chip and an apex area) in the magnitude of about 40 to about 100 µm.

In one embodiment, the support structures remain on the chip and, in a subsequent step, are covered, together with the conductive paths and any remaining free surface areas of the active side of the chip, when a non-conductive coating is formed over the active side of the integrated circuit element. This embodiment is very cost-effective because the step of removing the support structures can be omitted.

In another embodiment, one or more of the support structures are removed prior to forming the non-conductive coating, while one or more of the support structures remain on the chip and, in a subsequent step, are covered, together with the conductive paths and any remaining free surface areas of the active side of the chip. In an exemplary embodiment, a small number of support structures, for instance those located near the edge of the chip, are retained while all other support structures are removed prior to forming the non-conductive coating. The remaining support structures give support for the deadweight of the chip until the non-conductive coating is formed. The other conductive paths are free after their support structures have been removed, allowing these conductive paths to be restrained only by the material of the non-conductive coating.

In yet another embodiment, all support structures are removed, thus providing for the highest degree of independence from any restraints which may result from the support structures. However, in this case it must be ensured that the conducting paths are rigid enough to bear the deadweight of the chip until the non-conductive coating is applied and cured.

In any event, however, is the non-conductive coating formed in such a way that the interface pads remain free from the encapsulant to ensure that they are accessible from outside of the non-conductive coating in order to be connectable to corresponding contact pads of the printed wiring board.

Reference is now made to the figures. In FIG. 1A, on the active side of a die, or integrated circuit chip 1 (left), a number of support structures 2, in the form of polymer studs, are formed (middle). Each of the studs is placed adjacent an input/output pad 11 of the die 1. The studs 2 are frustum-shaped and protrude from the active side of the die 1 in such a manner that they provide a slope area 22 and an apex area 23 which is spaced apart from the active side of the die 1. Subsequently, a conductive coating is formed over the support structures 2 and the remaining areas of the active side including the input/output pads 11 and the conductive coating is structured so as to form a plurality of conductive paths 3, each comprising an interconnect pad 31 on top of an input/output pad 11, an interface pad 33 on top of the apex area 23 of a support structure 2 and a riser element 32 connecting the interconnect pad 31 and interface pad 33 and placed on the slope area 22.

In FIG. 1B, a number of known good dies 1 is picked and placed face down on a plane tape 4 with a predetermined distance between each two adjacent dies 1. FIG. 1C shows how the array of dies 1 disposed on the tape 4 are overmolded and underfilled at the same time in such a way that every die is completely embedded in a non-conductive coating 5. In one embodiment, the coating 5 is made of a polymer resin with a high filler particle content which is adapted to have a CTE with a value somewhere between the CTE of the integrated circuit chip 1 and the printed wiring board to which it will be attached in a subsequent assembly process. Finally, in FIG. 1D, the tape 4 is removed such that the interface pads 33 are laid open and the embedded array of dies 1 is trenched so that it is divided into individual packages, each of which comprises one die 1.

Another embodiment is shown in FIG. 2. A wafer as shown in FIG. 2A comprises a plurality of integrated circuit chips 1. According to the proposed method, each of the chips 1 is provided with support structures 2 (FIG. 2B), conductive paths 3 (FIG. 2C), the active side covered with a non-conductive coating 5 (FIG. 2D) and the inactive side overmolded with the same material that is used for the non-conductive coating 5 on the active side (FIG. 2E). Finally, the wafer is trenched (FIG. 2F) so that it is divided into individual packages, each of which comprises one die 1. In contrast to the first embodiment described with regard to FIG. 1, the dies 1 remain unseparated until after forming the non-conductive coatings 5, leading to truly chip-sized packages.

Figure 3B:
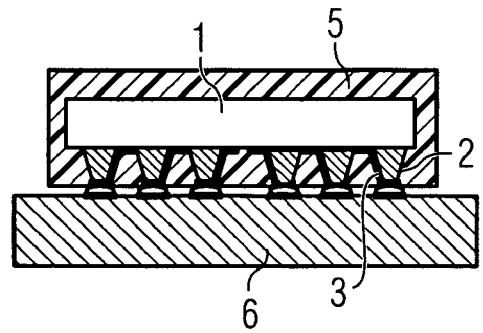
Figure 3C:
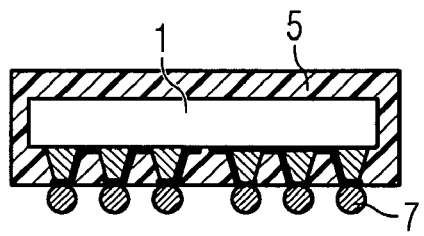
Figure 3D:
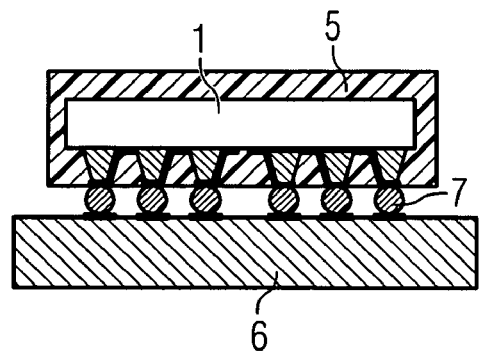
Figure 3E:
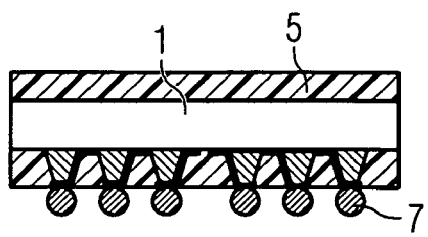
Figure 3F:
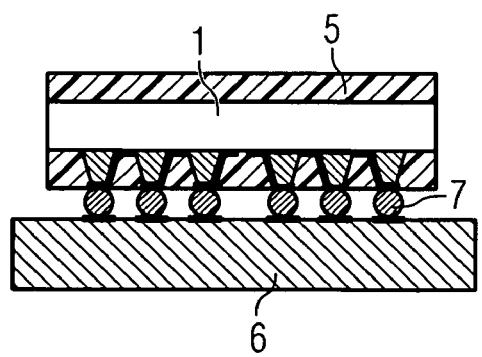

In FIG. 3, attachment variants for packages made according to the proposed method are illustrated. A package made according to the first embodiment (FIG. 3A), as described with regard to FIG. 1, may either directly be mounted onto pre-soldered pads of a next level board 6 (FIG. 3B), e.g., a laminate or other form of wiring board, or be provided with solder balls 7 on the interface pads 33 (FIG. 3C) and mounted onto the next level board 6 using these solder balls 7 (FIG. 3D). FIG. 3E shows a package made according to the second embodiment as described with regard to FIG. 2 which is provided with solder balls 7 on its interface pads 33 (FIG. 3E) and mounted onto the next level board 6 using these solder balls 7 (FIG. 3F). Although not shown in the figure, it is of course also possible to mount this type of package directly, i.e., without solder balls, onto pre-soldered pads of a next level board, in an analogous manner as shown in FIG. 3B.

FIG. 4 shows a method for making a package without support structures. The package shown in FIG. 4A is made according to the embodiment of FIG. 1. However, the principle described applies to all packages made according to any method described herein. After formation of the conductive paths 3, and before formation of the non-conductive coating 5, all support structures 2 are removed, leaving the conductive paths 3 protruding away from the active side of the integrated circuit chip 1 (FIG. 4B). The formation of the non-conductive coating 5 is done in such a way that the integrated circuit chip 1 is finally completely embedded in the polymer resin 5, leaving only the interface pads 33 accessible from the outside (FIG. 4C).

In a very similar manner, FIG. 5 shows a method for making a package with a reduced number of support structures 2. Again, the package shown in FIG. 5A is made according to the embodiment of FIG. 1, but the principle described applies to all packages made according to any method described herein. After formation of the conductive paths 3, and before formation of the non-conductive coating 5, some of the support structures 2 are removed (FIG. 5B). However, this time a small number of support structures 2 are retained to give support to the deadweight of the integrated circuit chip 1. Finally, a non-conductive coating 5 is formed such that the integrated circuit chip 1 is completely embedded in the polymer resin 5, leaving only the interface pads 33 accessible from the outside (FIG. 5C).

FIG. 6 compares the behavior of conventional packages under thermal load to that of packages made according to the proposed method. FIG. 6A shows a conventional BGA package which is placed face down on a next level substrate 6. The upper drawing illustrates how the plane chip 1 and the plane substrate 6 are electrically connected to each other in a reflow soldering process which takes place at a rather high temperature. At the end of this process both the chip 1 and the substrate 6 are still plane, but also hot. However, as the assembly cools down over time, the substrate 6 which has a relatively high CTE value, shrinks and is relatively strong while the chip 1, which has a relatively low CTE value, shrinks less than the substrate 6. This mismatch in shrinking of the two components leads to warpage of the whole assembly, as is illustrated in the lower drawing of FIG. 6A. This warpage may lead to damage of the package, rendering it useless.

In contrast, the packages made according to the proposed methods, as illustrated in FIG. 6B (package made according to the first embodiment described in FIG. 1) and FIG. 6C (package made according to the second embodiment described in FIG. 2) will not suffer from such a strong deformation. As can be seen from the drawings, when the substrate 6 shrinks, it will impose a shear stress on the interface pads 33 and the non-conductive coating 5 of the package. However, since the material of the non-conductive coating 5 is flexible and has an intermediary CTE, and since the conductive paths 3 are resilient and deformable, they will follow the shrinkage of the substrate 6, thus compensating for the shrinkage mismatch in the package and preventing, or at least alleviating, warpage.

What is claimed is:

1. A method for manufacturing a semiconductor component, the method comprising:
    providing an integrated circuit element with input/output pads located on an active side of the integrated circuit element;
    forming a plurality of non-conductive support structures on the active side of the integrated circuit element in areas that are free from input/output pads, each support structure comprising at least one apex area and at least one slope area extending from the active side to the apex area;
    forming a conductive interface pad on the apex area of each support structure and a conductive path across the slope of each support structure, such that the interface pad is electrically connected to the input/output pad of the integrated circuit element; and
    for at least one but not all of the plurality of conductive interface pads, removing all of the associated non-conductive support structure from the integrated circuit element after forming the conductive interface pads and the conductive paths.

2. The method of claim 1, further comprising forming a non-conductive coating over the active side of the integrated circuit element such that a surface is formed that leaves the interface pads electrically accessible.

3. The method of claim 1, wherein each support structure comprises a polymer stud.

4. The method of claim 3, wherein forming the plurality of support structures comprises forming the polymer stud using a printing process.

5. The method of claim 1, wherein forming the conductive interface pad and the conductive path comprises first forming a conductive layer over the active side of the integrated circuit element including support structures and input/output pads and then patterning the conductive layer into individual conductive paths.

6. The method of claim 5, wherein forming the conductive layer comprises performing a sputtering process.

7. The method of claim 5, wherein patterning the conductive layer comprises performing a photolithographic process.

8. The method of claim 1, further comprising forming a non-conductive coating over an inactive side of the integrated circuit element, the inactive side opposite the active side.

9. The method of claim 8, further comprising forming a non-conductive coating over the active side of the integrated circuit element.

10. The method of claim 9, wherein the non-conductive coatings on the inactive side and on the active side of the integrated circuit element are formed so as to have a similar thickness.

11. The method of claim 9, wherein the non-conductive coatings are made of a material with a coefficient of thermal expansion (CTE) value that is between a CTE value of the integrated circuit element and a CTE value of the wiring board.

12. The method of claim 1, wherein the integrated circuit element is part of a matrix array of like integrated circuit elements which are singulated after forming a non-conductive coating over the active side of the integrated circuit elements.

13. The method of claim 1, further comprising embedding the integrated circuit element in a non-conductive coating, the conductive interface pad being exposed after the embedding.

14. The method of claim 13, further comprising separating the integrated circuit element from a wafer of integrated circuits prior to embedding the integrated circuit in the non-conductive coating.

15. The method of claim 14, further comprising determining that the integrated circuit element is a known good die prior to embedding the integrated circuit element in the non-conductive coating.

16. The method according to claim 13, further comprising separating the integrated circuit element from a wafer of integrated circuits after embedding the integrated circuit element in the non-conductive coating.

17. The method of claim 13, further comprising mounting the integrated circuit element on a circuit board.

18. The method of claim 17, wherein mounting the integrated circuit element comprises directly mounting the integrated circuit element onto pre-soldered pads of the circuit board.

19. The method of claim 17, wherein mounting the integrated circuit element comprises providing a solder ball at an interface between the conductive interface pad of the integrated circuit element and a pad of the circuit board.

20. The method of claim 1, wherein removing at least one but not all of the plurality of non-conductive support structures comprises removing the non-conductive support structures in a middle of the integrated circuit element.

21. A method for manufacturing a semiconductor component, the method comprising:
    providing an integrated circuit element with input/output pads located on an active side of the integrated circuit element;
    forming a plurality of non-conductive support structures on the active side of the integrated circuit element in areas that are free from input/output pads, each support structure comprising at least one apex area and at least one slope area extending from the active side to the apex area;
    forming a conductive interface pad on the apex area of each support structure and a conductive path across the slope of each support structure, such that the interface pad is electrically connected to the input/output pad of the integrated circuit element; and
    removing at least one but not all of the plurality of non-conductive support structures from the integrated circuit element after forming the conductive interface pads and the conductive paths, wherein removing at least one but not all of the plurality of non-conductive support structures comprises removing all the non-conductive support structures other than the ones at an edge of the integrated circuit element.

* * * * *